United States Patent [19]
Ikegami

[11] Patent Number: 6,137,184
[45] Date of Patent: *Oct. 24, 2000

[54] FLIP-CHIP TYPE SEMICONDUCTOR DEVICE HAVING RECESSED-PROTRUDED ELECTRODES IN PRESS-FIT CONTACT

[75] Inventor: Gorou Ikegami, Shiga, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/067,421

[22] Filed: Apr. 28, 1998

[30] Foreign Application Priority Data

Apr. 28, 1997 [JP] Japan .................................... 9-109954

[51] Int. Cl.⁷ .............................. H01L 23/48; H01L 23/52
[52] U.S. Cl. ......................... 257/785; 257/734; 257/737; 257/739; 257/750; 257/778; 257/780; 257/781; 257/786
[58] Field of Search ..................................... 257/777, 780, 257/781, 785, 786, 739, 734, 737, 750, 778

[56] References Cited

U.S. PATENT DOCUMENTS

| | | | |
|---|---|---|---|
| Re. 35,119 | 12/1995 | Blonder et al. | 257/739 |
| 4,784,972 | 11/1988 | Hatada | 437/182 |
| 5,193,140 | 3/1993 | Minde . | |
| 5,323,035 | 6/1994 | Leedy | 257/248 |
| 5,329,428 | 7/1994 | Farnworth et al. | 156/654 |
| 5,473,197 | 12/1995 | Idaka et al. | 257/786 |
| 5,483,741 | 1/1996 | Akram et al. | 29/846 |
| 5,592,736 | 1/1997 | Akram et al. | 29/842 |
| 5,600,180 | 2/1997 | Kusaka et al. | 257/692 |
| 5,668,410 | 9/1997 | Yamaoto | 257/737 |
| 5,677,576 | 10/1997 | Akagawa | 257/785 |
| 5,705,858 | 1/1998 | Tsukamoto | 257/778 |
| 5,767,580 | 6/1998 | Rostoker | 257/737 |
| 5,844,320 | 12/1998 | Ono et al. | 257/778 |
| 5,866,950 | 2/1999 | Iwasaki et al. | 257/782 |
| 5,883,432 | 3/1999 | Higashiguchi | 257/727 |
| 5,912,510 | 6/1999 | Hwang et al. | 257/778 |
| 5,929,521 | 7/1999 | Wark et al. | 257/737 |
| 5,990,554 | 11/1999 | Golubic et al. | 257/734 |
| 6,005,290 | 12/1999 | Akram et al. | 257/723 |

FOREIGN PATENT DOCUMENTS 6-268016  9/1994  Japan .

OTHER PUBLICATIONS

Gruet, C. et al., "Experiments with a Regular Pulse Celp Coder for the Pan European Half Rate Channel", IEEE, 1991, ICASSP 91, Speech Processing 1, pp. 617–620.

Le Guyader, A. et al., "Embedded Algebraic Celp Coders for Wideband Speech Coding", *Signal Processing Theories and Applications*, Brussels, 1992, vol. 1, pp. 527–530.

*Primary Examiner*—Jerome Jackson, Jr.
*Assistant Examiner*—Bradley William Baumeister
*Attorney, Agent, or Firm*—Hutchins, Wheeler & Dittmar

[57] ABSTRACT

A flip-chip type semiconductor device comprises a semiconductor pellet having bump electrodes formed on one main surface thereof, a wiring board having pad electrodes formed corresponding to the bump electrodes, the wiring board being disposed opposite to the semiconductor pellet, the bump electrodes contacting the pad electrodes, and a resin for causing the semiconductor pellet and the wiring board to adhere to each other, wherein a convex portion of each of the pad electrodes is press-fitted to each of the pad electrodes. Thus, the connecting strength between a bump electrode and a pad electrode is remarkably improved. Even if the resin between the semiconductor pellet and the wiring board cracks, the press-fitting state between the bump electrode and the pad electrode can be sufficiently kept.

19 Claims, 4 Drawing Sheets

FLIP-CHIP TYPE SEMICONDUCTOR DEVICE HAVING RECESSED-PROTRUDED ELECTRODES IN PRESS-FIT CONTACT

BACKGROUND OF THE INVENTION

1. Field of the Invention

The present invention relates to a semiconductor device of the type having bump electrodes projecting from the surface of a chip. Such type of semiconductor device is so-called as a "flip-chip type" semiconductor device.

2. Description of the Related Art

To accomplish small electronic units, the sizes of electronic parts have been decreased with advanced functions and high integration.

Semiconductor devices such as electronic parts are coated with resin. In order to further minimize the sizes of semiconductor devices, bare chips have been used. The bare chips are directly mounted on wiring boards.

FIG. 1 shows an example of a conventional bare-chip type semiconductor device. In FIG. 1, reference numeral 1 depicts a semiconductor pellet having a semiconductor substrate 2 and many semiconductor devices (not shown) formed therein. The semiconductor devices form a particular electronic circuit with internal connections in the semiconductor substrate 2. The semiconductor substrate 2 has an insulation film (not shown) formed on one main surface thereof. This insulation film has opening portions for which the semiconductor devices are connected. A base electrode 3 is disposed at each opening portion of the insulation film. The base electrode 3 is connected to a corresponding bump electrode 4.

The base electrode 3 comprises a single layer of aluminum or a laminate of a plurality of layers of metal such as titanium and gold. The base electrode 3 is connected to the semiconductor substrate 2 with a resistance. When the base electrode 3 is a laminate of layers of titanium and gold, the bump electrode 4 comprises a metal which has a good connecting characteristic. An example of the material of the bump electrode 4 is a plated layer of gold.

In FIG. 1, reference numeral 5 depicts a wiring board. A conductive pattern is formed on an insulation board 6 composed of an insulation material such as ceramics or resins. As shown in a circular window on the right side of FIG. 1, an electrode portion 7 is disposed opposite to the bump electrode 4 of the semiconductor pellet 1. When the insulation board 6 comprises a ceramic material, a conductive pattern is formed by a printing process or baking process of a silver palladium conductive paint. On the other hand, when the insulation board 6 comprises a resin, the conductive pattern is formed by an etching process of a conductive foil in a desired pattern.

The conductive pattern except for the electrode portion 7 and an external connection terminal (not shown) is coated with a resist film (not shown). The electrode portion 7 which is not coated with the resist film is coated with hard metal layer 8 comprising metal such as nickel and a thin gold film 9 which allows an electric connection to be secured, thereby to constitute a pad electrode 10.

The semiconductor pellet 1 and the wiring board 5 are disposed so that they face each other. The bump electrode 4 and the pad electrode 10 are layered. The bump electrode 4 is heated and pressed at the layered portion so as to deform plastically the bump electrode 4. Thus, since gold of the bump electrode 4 and gold of the thin film 9 of the pad electrode 10 are press-fitted, an electric connection between the bump electrode 4 and the gold thin film 9 is secured.

Reference numeral 11 depicts a resin which bonds the semiconductor pellet 1 to the wiring board 5. The resin is coated on the wiring board 5 before the above-mentioned press-fitting process is performed. Alternatively, when the electrodes 4 and 7 are press-contacted, the resin is filled in the space between the semiconductor pellet 1 and the wiring board 5. Then, in the pressuring state of the semiconductor pellet 1, the resin is heated at around 200° C. for a few minutes so as to harden the resin.

When the resin 11 hardens, it will contract. Thus, the bump electrode 4 and the pad electrode 10 are kept pressed.

In such a conventional semiconductor device, as described above, by plastically deforming the layered portion of the bump electrode 4 and the pad electrode 10 and press-contacting them, an electric connection thereof is secured. The boding strength of the resin 11 causes the electric connection to be kept.

However, when the wiring board 5 comprises a resin, the wiring board would be bent, if the wiring board 5 is pressed or the temperature therearound varies due to its thermal expansion or contraction. Thus, tensions work at bonding interfaces between the semiconductor pellet 1 and the resin 11 and between the wiring board 5 and the resin 11. Consequently, the tensions cause the connecting surface between the bump electrode 4 and the pad electrode 10 to peel off.

When a crack occurs in the resin 11 disposed between the semiconductor pellet 1 and the wiring board 5, the pressuring state cannot be kept between the bump electrode 4 and the pad electrode 10, thereby deteriorating the electric connection.

An attempt for solving such a problem has been proposed in Japanese Patent Laid-Open Publication No. 6-268016. In this related art reference, as shown in FIG. 2, a groove or a concave portion 10a is formed at a pad electrode 10 of a wiring board 5. A bump electrode 4 is fitted to the concave portion 10a. In other words, the concave portion 10a allows a semiconductor pellet 1 and the wiring board 5 to align. Thus, the bump electrode 4 and the pad electrode 10 are connected without a displacement. As with the structure shown in FIG. 1, the semiconductor pellet 1 and the wiring board 5 are bonded with a resin. In the related art reference shown in FIG. 2, the bump electrode 4 comprises a solder. With a re-flowing process of the solder of the bump electrode 4, the bump electrode 4 and the pad electrode 10 are connected.

In the semiconductor device shown in FIG. 2, since an almost vertical side wall of the bump electrode 4 is surrounded by a side wall of the concave portion 10a of the pad electrode 10, even if the resin cracks, it is supposed that an electric connection between the bump electrode 4 and the pad electrode 10 is secured. However, when the wiring board 10 thermally expands or contracts in the direction in parallel with the direction of the semiconductor pellet 1, a displacement takes place between the bump electrode 4 and the pad electrode 10 in the direction of the thermal expansion or contraction. Thus, the side wall of the bump electrode 4 presses the side wall of the concave portion 10 and thereby the concave portion 10a deforms in such a manner that the width thereof increases. Thus, in the structure of which the bump electrode 4 and the pad electrode 10 are press-contacted, if the resin cracks, the contact of the semiconductor pellet 1 and the wiring board 5 becomes imperfect and thereby the electric connection thereof becomes imperfect.

To remove an unstable factor of the electric connection, it is necessary to connect the bump electrode 4 and the pad electrode 10 by the re-flowing process. The size of the pad electrode 10 should be larger than that of the structure shown in FIG. 1 because of the necessity of the concave portion 10*a* for the bump electrode 4. Thus, since the interval of the adjacent pad electrodes 10 becomes narrow, the withstand voltage drops and thereby a short-circuit tends to occur. As a result, the structure shown in FIG. 2 cannot be applied to the semiconductor device shown in FIG. 1.

SUMMARY OF THE INVENTION

The present invention provides a useful solutions for the above-mentioned problems.

The flip-chip type semiconductor device of the present invention comprises a semiconductor pellet having a plurality of bump electrodes formed on one main surface thereof, a wiring board having pad electrodes formed corresponding to the bump electrodes, the wiring board being disposed opposite to the semiconductor pellet, the bump electrodes contacting the pad electrodes, and a resin for causing the semiconductor pellet and the wiring board to adhere to each other, wherein a convex portion of each of the pad electrodes is press-fitted to each of the pad electrodes so as to mechanically and electrically connect the pad electrode and the bump electrode.

The convex portion formed on the pad electrode is press-fitted to the bump electrode formed on the semiconductor pellet. Thus, the connecting strength can be improved. The convex portion is formed by etching a part of the pad electrode.

The convex portion is formed by radiating laser light to the pad electrode. In this case, the wiring board is coated with a protection film. By radiating laser light to the protection film, the convex portion is formed. The convex portion prevents foreign matter from adhering to an undesired portion of the wiring board.

When the bump electrode of the semiconductor pellet comprises a soft metal and the pad electrode of the wiring board comprises a hard metal, the convex portion can be more smoothly press-fitted to the bump electrode.

These and other objects, features and advantages of the present invention will become more apparent in light of the following detailed description of a best mode embodiment thereof, as illustrated in the accompanying drawings.

DESCRIPTION OF PREFERRED EMBODIMENTS

The semiconductor device according to the present invention will be described with reference to the accompanying drawings.

Figure 1:
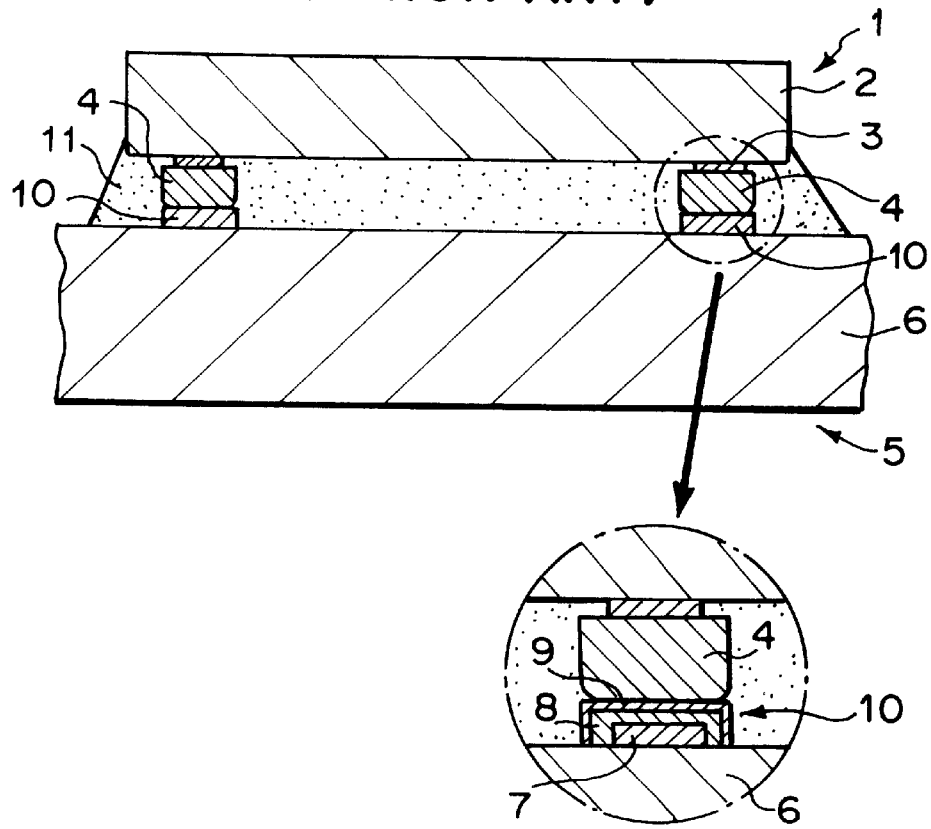
FIG. 1 is a sectional view showing the structure of a conventional semiconductor device.
Figure 2:
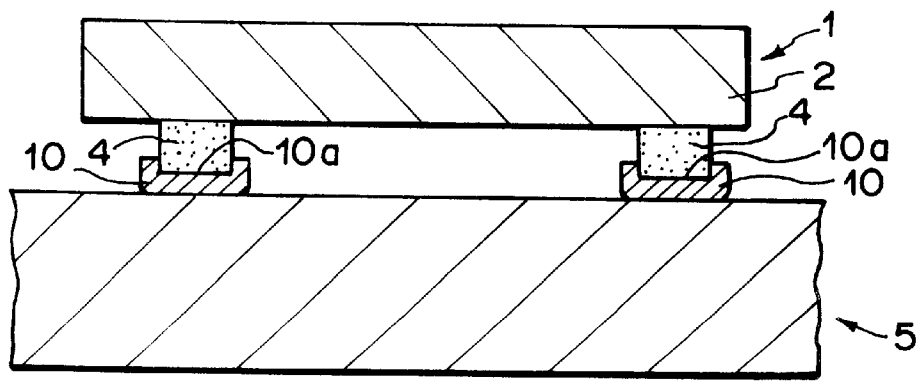
FIG. 2 is a sectional view showing a conventional semiconductor device which allows a bump electrode and a pad electrode to be satisfactorily aligned.
Figure 3:
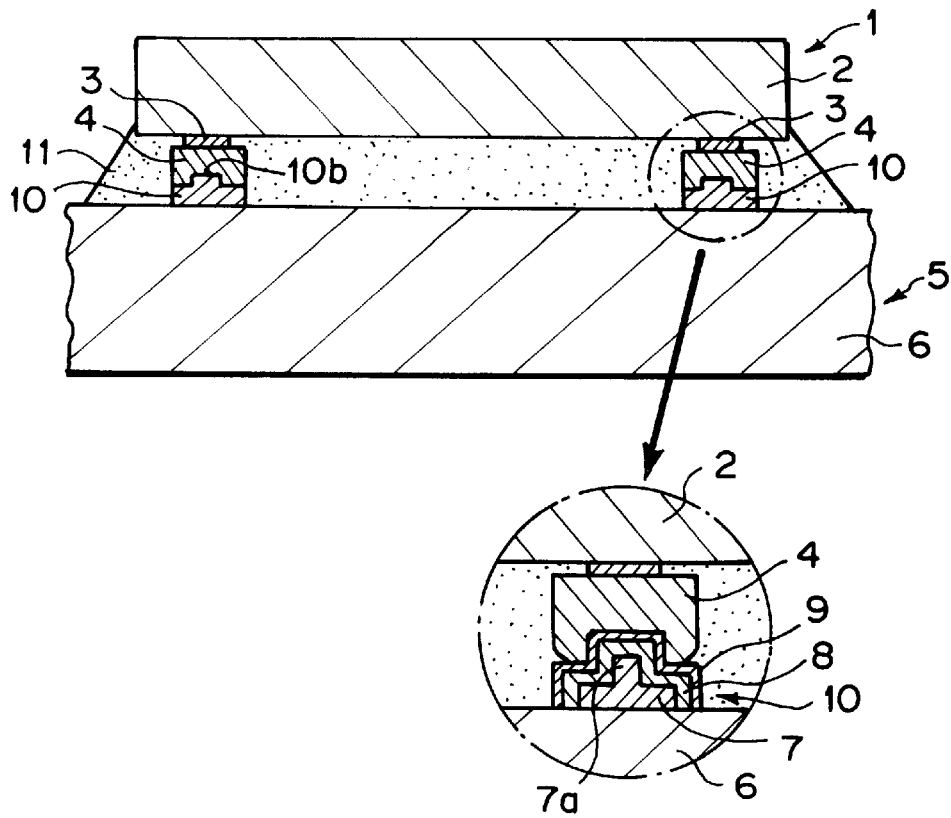
FIG. 3 is a sectional view showing a part of a semiconductor device according to the present invention.

For simplicity, in FIG. 3, similar portions to those in FIG. 1 are denoted by similar reference numerals and their description is omitted. The structure shown in FIG. 3 is different from and the structure shown in FIG. 1 in that a convex portion 10*b* whose area is smaller than the area of the contacting surface of the bump electrode 4 of the semiconductor pellet 1 is formed in a pad electrode 10 on a wiring board 5.

Figure 4:
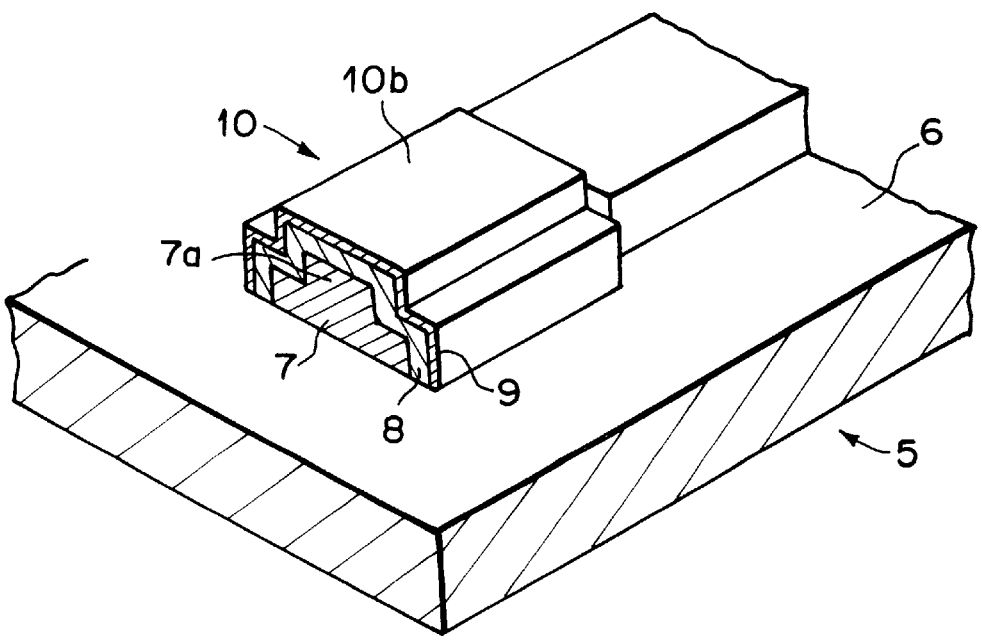
FIG. 4 is a perspective view showing a part of a wiring board used in the device shown in FIG. 3.

As shown in FIG. 4, an electrode portion 7 as a conductive pattern has a protrusion portion 7*a* which extends in the vertical direction thereof. The protrusion portion 7*a* is disposed at a center portion in the horizontal direction of the convex portion 10*b*. The protrusion portion 7*a* is formed by removing both edge portions from the upper surface of the electrode portion 7 by a proper means such as an etching process. A hard metal layer 8 and a gold thin film 9 are successively plated on the front surface of the protrusion portion 7*a* so that the electrode portion 7 has sufficient hardness and high oxidizing resistance.

When the length of each side and height of the bump electrode 4 are 100 $\mu$m and 50 $\mu$m, respectively, the thickness and width of the electrode portion 7 are for example 18 $\mu$m and 100 $\mu$m, respectively. The protrusion portion 7*a* whose width is 6 $\mu$m and whose height is 5 $\mu$m is disposed on the electrode portion 7. The protrusion portion 7*a* is preferably coated with the hard metal layer 8 comprising nickel and having a thickness of 3 to 5 $\mu$m. The gold thin film 9 whose thickness is in the range from 0.03 to 0.05 $\mu$m is coated on the hard metal layer 8 so as to prevent the hard metal layer 8 from being oxidized. The convex portion 10*b* is disposed on the metal thin film 9.

In FIG. 3, the electrode portion 7 having the convex portion 10*b* is disposed below the bump electrode 4 in such a manner that the convex portion 10*b* contracts the lower surface of the bump electrode 4. Thus, the convex portion 10*b* fits the concave portion of the bump electrode 4. Actually, the electrode portion 7 and the bump electrode 4 are disposed in such a manner that the electrode portion 7 and the bump electrode 4 are contacted and then the semiconductor pellet 1 and the wiring board 5 are pressed in such direction that they approach each other. In this case, the lowest edge surface of the convex portion 10*b* is contacted to the edge surface of the bump electrode 4. Thereafter, the convex portion 10*b* is press-fitted to the convex portion of the bump electrode 4.

Figure 5:
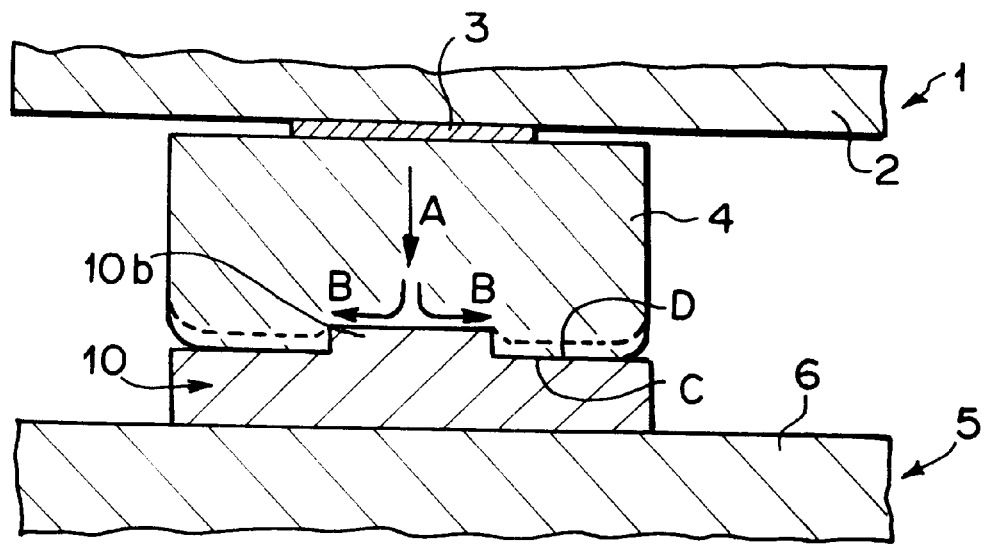
FIG. 5 is an enlarged sectional view showing a connected portion of a bump electrode and a pad electrode shown in FIG. 3.

At this point, as shown in FIG. 5, the convex portion 10*b* and the bump electrode 4 are relatively moved in the direction (direction denoted by arrow B in FIG. 5) perpendicular to the moving direction (direction denoted by arrow A shown in FIG. 5) of the bump electrode 4 at the contacting portion of the electrode portion 7 and the bump electrode 4. Thus, the resultant friction causes the material of the bump electrode 4 to be exposed on the contacting surface. Since the convex portion 10*b* is coated with the metal layer 8 which is harder than the bump electrode 4 and the electrode portion 7, the convex portion 10*b* is hardly deformed. The gold of the bump electrode 4 frictionally displaces the gold thin film 9 or the lower nickel layer 8. After the convex portion 10*b* is fitted to the concave portion of the bump electrode 4, the bump electrode 4 and the pad electrode 10 are securely connected.

When the convex portion 10b is press-fitted to the bump electrode 4, an edge surface of the bump electrode 4 adjacent to a side wall of the convex portion 10b protrudes from the peripheral portion of the edge surface of the bump electrode 4. When the convex portion 10b is further press-fitted to the bump electrode 4, a protruded portion C contacts a shoulder portion D of the pad electrode 10 and thereby the edge surface of the bump electrode 4 closely contacts the periphery of the pad electrode 10. Likewise, at the shoulder portion D, the bump electrode metal frictionally displaces in the direction of the surface of the pad electrode 10. After the convex portion 10b is fitted to the concave portion of the bump electrode 4, the shoulder portion D and the bump electrode 4 are securely contacted.

Thus, the connecting strength of the structure of shown in FIG. 3 is much higher than the connecting strength of the structure of which the bump electrode 4 and the pad electrode 10 are press-contacted and plastically deformed. Even if the resin 11 is peeled off from the semiconductor pellet 1 or the wiring board 5 and thereby the press-contacting strength decreases, the connecting state of the bump electrode 4 and the pad electrode 10 can be stably kept.

In addition, since the gold bump electrode 4 does not melt and the convex portion 10b does not cause the bump electrode 4 to swell, the bump electrode 4 and the pad electrode 10 can be structured so that their sizes are the same. Thus, adjacent pad electrodes 10 can be disposed at sufficient intervals. In addition, the decrease of the withstand voltage and short-circuit can be prevented.

Figure 6:
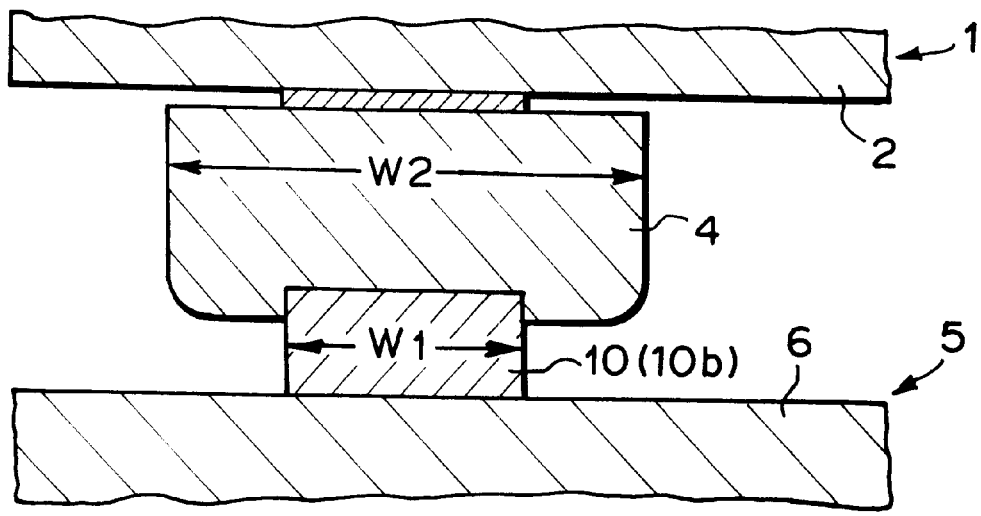
FIG. 6 is an enlarged sectional view showing a part of another semiconductor device according to the present invention.

FIG. 6 shows the structure of a semiconductor device according to another embodiment of the present invention. In FIG. 6, similar portions to those of FIGS. 1 and 3 are denoted by similar reference numerals and redundant description is omitted.

The structure shown in FIG. 6 is different from the structures shown in FIGS. 3 and 1 in a pad electrode 10. In the structure shown in FIG. 6, the width W1 of a pad electrode 10 is smaller than the width W2 of a bump electrode 4.

In the embodiment shown in FIG. 6, the bump electrode 4 is formed in a square shape whose one side is 100 $\mu$m. The width of the pad electrode 10 including a hard metal layer and a plated layer coated thereon is for example 60 $\mu$m.

The pad electrode 10 functions as a convex portion which is press-fitted to the bump electrode 4. When the semiconductor pellet 1 is press-fitted, the load gathers on the contacting surface with the pad electrode 10. In this structure, since the ratio of the areas of the pad electrode 10 and the bump electrode 4 is 0.6, the load per unit area is amplified by 1.7 times. Thus, the pad electrode 10 can be easily press-fitted to the pad electrode 10 for a depth of around 5 $\mu$m.

As with the structure shown in FIG. 3, when the pad electrode 10 is press-fitted to the bump electrode 4, a friction takes place on the contacting surface thereof. The friction causes the materials of the electrode 10 and the bump electrode 4 to expose. These materials securely adhere to each other.

In the semiconductor device, before the semiconductor pellet 1 and the wiring board 5 are bonded with the resin 11, when the pellet is peeled off from the wiring board, part of the hard metal layer 8 adheres to the bump electrode 4. Thus, it is clear that the bonding strength is remarkably improved.

Figure 7:
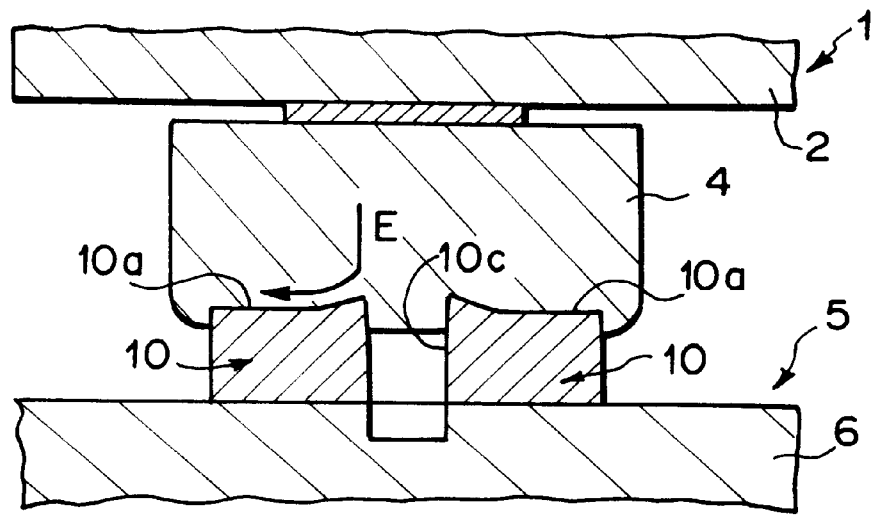
FIG. 7 is an enlarged sectional view showing a part of another semiconductor device according to the present invention.

FIG. 7 shows the structure of a semiconductor device according to another embodiment of the present invention. In FIG. 7, similar portions to those of FIGS. 1 and 3 are shown by same reference numerals and redundant description is omitted.

The pad electrodes 10 shown in FIGS. 3 and 6 are formed by an etching process of a conductive foil. However, in the embodiment shown in FIG. 7, a pad electrode is formed by a laser radiating process.

In other words, in the structure shown in FIG. 7, an opening portion 10c is formed at a center portion of the pad electrode 10 by laser radiation. With the opening portion 10c, a convex portion 10d which is press-fitted to a bump electrode 4 is formed. When the opening portion 10c is formed, the laser light reaches a part of an insulation board 6 through the pad electrode 10. An inner peripheral portion of the opening portion 10c melts and swells due to the laser radiation. Thus, the surface of the pad electrode 10 inclines toward the outer periphery.

When the convex portion 10d is formed, the front surface of the wiring board 5 is coated with an insulation film comprising for example a resin. Thus, the insulation film can prevent melted chips of the pad electrode 10 due to the laser ration from adhering to the wiring board 5.

As with the semiconductor device shown in FIG. 3, in the semiconductor device shown in FIG. 7, the convex portion 10d of the pad electrode 10 is press-fitted to the bump electrode 4. At this point, since the upper surface of the pad electrode 10 inclines toward the outer periphery, the bump electrode 4 displaces on the contacting surface toward the outer periphery of thereof as denoted by arrow E. Since the displacement of the bump electrode 4 takes place toward the outer periphery thereof, the friction between the bump electrode 4 and the pad electrode 10 offsets in the direction. In addition, since the front surface of the pad electrode 10 inclines toward the outer periphery thereof, the pad electrode 10 is smoothly press-fitted to the bump electrode 4. Thus, the pad electrode 10 and the bump electrode 4 are securely connected.

Figure 8:
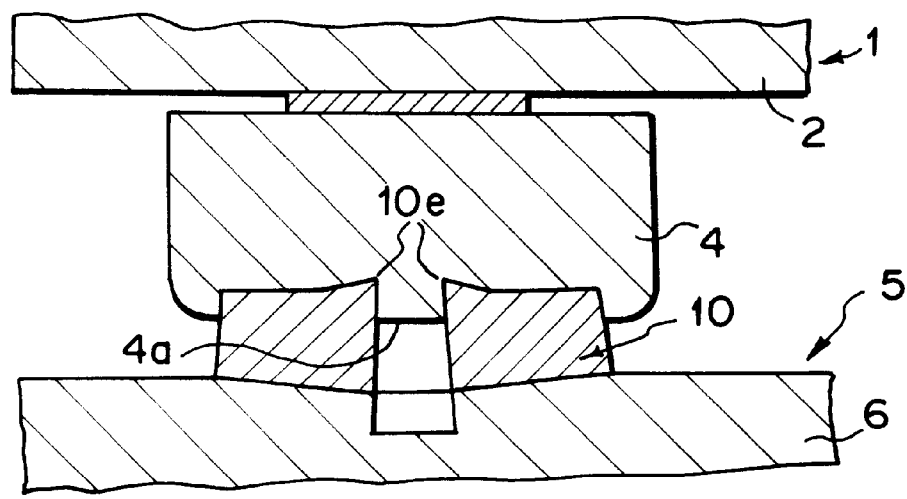
FIG. 8 is an enlarged sectional view showing a part of another semiconductor device according to the present invention.

In the case that the insulation board 6 comprises a resin with elasticity, when the insulation board 6 is heated, it softens. When the pad electrode 10 is press-fitted to the bump electrode 4, the load applied thereto causes the contacting surface therebetween to deform. Thus, the pad electrode 10 inclines as shown in FIG. 8. Consequently, the diameter of the opening portion 10c decreases and thereby an outer peripheral portion 10e of the pad electrode 10 intrudes into a protruded portion 4a at the lower edge of the bump electrode 4, thereby preventing the pad electrode 10 from peeling off.

In the case that the opening portion 10c reaches a part of the insulation board 6, when the pad electrode 10 is press-fitted to the bump electrode 4, the load causes the inner periphery of the pad electrode 10 to be more sharply inclined.

It should be noted that the present invention is not limited to the above-described embodiments. Instead, various modifications are available. For example, the convex portion of the pad electrode can be formed in any shape available by the etching process or laser radiating process. Preferable shapes of the pad electrode 10 are a straight line, a straight strip, a sequence of dots, a plurality of parallel lines, grid lines, a + letter mark, and an X letter mark. The convex portion of the pad electrode 10 can be formed by raising a particular portion from the other portion or lowering the other portion from the particular portion.

In addition, the material of the hard metal layer as a plated layer of the pad electrode 10 is not limited to nickel. Instead, any metal which is harder than the material of the bump electrode 4 can be used.

As described above, according to the present invention, the connecting strength of the bump electrode and the pad electrode can be remarkably improved. Even if a resin disposed between the semiconductor pellet and the wiring board cracks, the press-contacting state of the bump electrode and the pad electrode can be kept. Thus, a semiconductor device with high reliability can be accomplished.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A flip-chip type semiconductor device comprising:
   a semiconductor pellet having a plurality of bump electrodes formed on one main surface thereof, with a recess formed on each of said bump electrodes, said recess having at least one recess wall surface oriented substantially perpendicular to the main surface;
   a wiring board having pad electrodes formed corresponding to said bump electrodes, said wiring board being disposed opposite to said semiconductor pellet and the bump electrodes contacting the pad electrodes;
   a resin for causing said semiconductor pellet and said wiring board to adhere to each other; and
   a protrusion formed on each of said pad electrodes, said protrusion having at least one protrusion wall surface oriented substantially perpendicular to the main surface and adapted to mate with said recess wall surface, said protrusion further covered with a first metal layer and a second metal layer covering said first metal layer, said first metal layer being harder than both the bump electrode and said second metal layer, wherein said protrusion is press-fitted into the corresponding bump electrode so as to mechanically and electrically connect said pad electrode and said bump electrode.

2. The semiconductor device of claim 1, wherein the protrusion is formed by partly etching the pad electrode.

3. The semiconductor device of claim 1, wherein the protrusion is formed by radiating laser light to the pad electrode.

4. The semiconductor device of claim 3, wherein said wiring board is coated with a protection film, and wherein the protrusion is formed by radiating laser light to the pad electrode.

5. A semiconductor device, comprising:
   a semiconductor pellet having a main surface;
   at least one bump electrode formed on said main surface, said bump electrode having a recessed portion; and
   at least one pad electrode having a protrusion covered with a first metal and a second metal, with the first metal being harder than the bump electrode and the second metal, and mating with the recessed portion to form a press-fitted connection between the pad electrode and the bump electrode.

6. A semiconductor device, according to claim 5, further comprising:
   a wiring board,
   wherein the at least one pad electrode is disposed on a surface of said wiring board at locations corresponding to locations of said at least one bump electrode and said wiring board is electrically coupled to said semiconductor pellet by said press-fitted connection.

7. A semiconductor device, according to claim 6, wherein each of said protrusions has a surface area smaller than a contacting area of a corresponding one of said bump electrodes.

8. A semiconductor device, according to claim 6, wherein said pad electrodes have shapes corresponding to one or more of: a straight line, a straight strip, a sequence of dots, a plurality of parallel lines, grid lines, a plus shape, and an X shape.

9. A semiconductor device, according to claim 6, wherein said pad electrodes have a width that is less than a width of said bump electrodes.

10. A semiconductor device, according to claim 9, wherein a ratio of the width of said bump electrodes to the width of said pad electrodes is about 1.7.

11. A semiconductor device, according to claim 6, wherein said bump electrode includes gold and said pad electrode includes nickel.

12. A semiconductor device, comprising:
    a wiring board;
    a plurality of pad electrodes disposed on a surface of said wiring board and having a portion connected to said wiring board and a protrusion projecting from the portion, said protrusion covered with a first metal and a second metal, with the first metal being harder than the second metal and the material of a plurality of bump electrodes, each bump electrode having a recess adapted to be press-fitted to said pad electrodes to provide electrical connections to the wiring board.

13. A semiconductor device, according to claim 12, wherein said pad electrodes have shapes corresponding to one or more of: a straight line, a straight strip, a sequence of dots, a plurality of parallel lines, grid lines, a plus shape, and an X shape.

14. A semiconductor device, according to claim 12, further comprising:
    a semiconductor pellet having a main surface; and
    a plurality of bump electrodes formed on said main surface, said bump electrodes having a portion that accepts the covered protrusion of said pad electrodes to provide electrical coupling between said pellet and said wiring board.

15. A semiconductor device, according to claim 14, wherein each of said protrusions of said pad electrodes has a surface area smaller than a contacting area of a corresponding one of said bump electrodes.

16. A semiconductor device comprising:
    a semiconductor pellet;
    a plurality of base electrodes formed on a surface of said semiconductor pellet;
    a plurality of bump electrodes corresponding to said base electrodes, respectively;
    a wiring board;
    a plurality of electrode portions formed on said wiring board;
    a plurality of first metal layers covering said corresponding electrode portions, respectively;
    a plurality of second metal layers covering said corresponding first metal layers;
    each electrode portion comprising a rectangular portion connected to said wiring board and a first protrusion projecting from said rectangular portion;
    each first metal layer consisting of a metal harder than said bump electrodes and said second metal layers and having a second protrusion corresponding to said first protrusion of said electrode portions;

said second metal layer having a third protrusion corresponding to said second protrusion of said first metal layer; and said bump electrodes being connected to said corresponding second metal layers to cover said third protrusion, wherein said bump electrodes are press-fitted into corresponding ones of said electrode portions to mechanically and electrically connect said bump electrodes and said corresponding electrode portions in a press-fitted bond.

17. The semiconductor device of claim 16, wherein said wiring board is coated with a protection film.

18. The semiconductor device of claim 16, wherein said bump electrodes include an opening portion that accepts a protruding portion of said electrode portions.

19. The semiconductor device of claim 18, wherein said opening portion of said bump electrodes has a surface area smaller than a contacting area of a corresponding one of said electrode portions.

* * * * *